US012081331B2

(12) United States Patent
Brox et al.

(10) Patent No.: US 12,081,331 B2
(45) Date of Patent: Sep. 3, 2024

(54) ADAPTING CHANNEL CURRENT

(71) Applicant: Micron Technology, Inc., Boise, ID (US)

(72) Inventors: Martin Brox, Munich (DE); Peter Mayer, Neubiberg (DE); Michael Dieter Richter, Ottobrunn (DE); Thomas Hein, Munich (DE); Wolfgang Anton Spirkl, Germering (DE)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 16/579,275

(22) Filed: Sep. 23, 2019

(65) Prior Publication Data
US 2020/0119838 A1  Apr. 16, 2020

Related U.S. Application Data

(60) Provisional application No. 62/744,907, filed on Oct. 12, 2018.

(51) Int. Cl.
*H04L 1/00* (2006.01)
*G11C 7/10* (2006.01)
(Continued)

(52) U.S. Cl.
CPC .......... *H04L 1/0032* (2013.01); *G11C 7/1057* (2013.01); *G11C 11/56* (2013.01); *H04L 1/0014* (2013.01); *H04L 1/0046* (2013.01)

(58) Field of Classification Search
CPC ... H04L 1/0032; H04L 1/0014; H04L 1/0046; G11C 7/1057; G11C 11/56
(Continued)

(56) References Cited

U.S. PATENT DOCUMENTS

2002/0118580 A1   8/2002   Santin
2002/0176285 A1  11/2002   Hunt
(Continued)

FOREIGN PATENT DOCUMENTS

WO   WO-2013011344 A1 *  1/2013  ............. H03M 1/06
WO      2017058357 A1     4/2017
(Continued)

OTHER PUBLICATIONS

ISA/KR, International Search Report and Written Opinion of the International Searching Authority, Int'l. Appl. No. PCT/US2019/054322, dated Jan. 23, 2020, Korean Intellectual Property Office, Seo-gu, Daejeon, Republic of Korea, 10 pgs.
(Continued)

Primary Examiner — Xuan Lu
(74) Attorney, Agent, or Firm — Holland & Hart LLP

(57) ABSTRACT

Methods, systems, and devices for operating memory cell(s) using adapting the current on a channel are described. A current on a channel may be adapted during a transition period between signaling a first logic value over the channel and signaling a second (e.g. subsequent) logic value over the channel. Adapting the current may include increasing or decreasing the current on the channel during the transition period. The degree of adaptation may be based on a difference between the first logic value and the subsequent logic value. In some cases, a logic circuit may be configured to determine a difference between the first and subsequent logic value. The logic circuit may be further configured to communicate the difference to an adaptive driver. And the adaptive driver may adapt a current of the channel based on the communicated difference.

24 Claims, 8 Drawing Sheets

(51) Int. Cl.
  *G11C 11/22* (2006.01)
  *G11C 11/56* (2006.01)
  *H04L 25/02* (2006.01)
  *H04L 25/49* (2006.01)

(58) Field of Classification Search
  USPC .......................................................... 370/329
  See application file for complete search history.

(56) References Cited

U.S. PATENT DOCUMENTS

| | | |
|---|---|---|
| 2004/0022112 A1 | 2/2004 | Tran et al. |
| 2005/0134307 A1* | 6/2005 | Stojanovic .......... H04L 25/4906 326/31 |
| 2007/0080718 A1* | 4/2007 | Stojanovic ............ H04L 25/061 326/87 |
| 2008/0061826 A1* | 3/2008 | De Araujo .......... H04L 25/0286 326/82 |
| 2010/0266006 A1* | 10/2010 | Werner ............... H04L 25/4906 375/232 |
| 2018/0136707 A1 | 5/2018 | Ha et al. |
| 2018/0278440 A1* | 9/2018 | Dong ................... G11C 7/1069 |

FOREIGN PATENT DOCUMENTS

| | | | |
|---|---|---|---|
| WO | 2017192209 A1 | 11/2017 | |
| WO | WO-2017192209 A1 * | 11/2017 | ............. G11C 7/106 |

OTHER PUBLICATIONS

European Patent Office, "Extended Search Report," issued in connection with European Patent Application No. 19871235.8, dated Oct. 22, 2021 (9 pages).

* cited by examiner

ADAPTING CHANNEL CURRENT

CROSS REFERENCE

The present Application for Patent claims priority to U.S. Provisional Patent Application No. 62/744,907 by Brox et al., entitled "ADAPTING CHANNEL CURRENT," filed Oct. 12, 2018, which is assigned to the assignee hereof and is expressly incorporated by reference in its entirety.

BACKGROUND

The following relates generally to operating a memory array and more specifically to adapting the current on a channel.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

Non-binary modulation schemes, in which modulation symbols each represent more than one bit of information may be referred to as multi-level modulation schemes, and signaling techniques in accordance with such modulation schemes may be referred to as multi-level signaling. Memory devices may communicate with one another over a channel using multi-level signaling. Procedures to enhance multi-level communications and ensure that data is effectively and efficiently communicated are desired.

DETAILED DESCRIPTION

Figure 1:
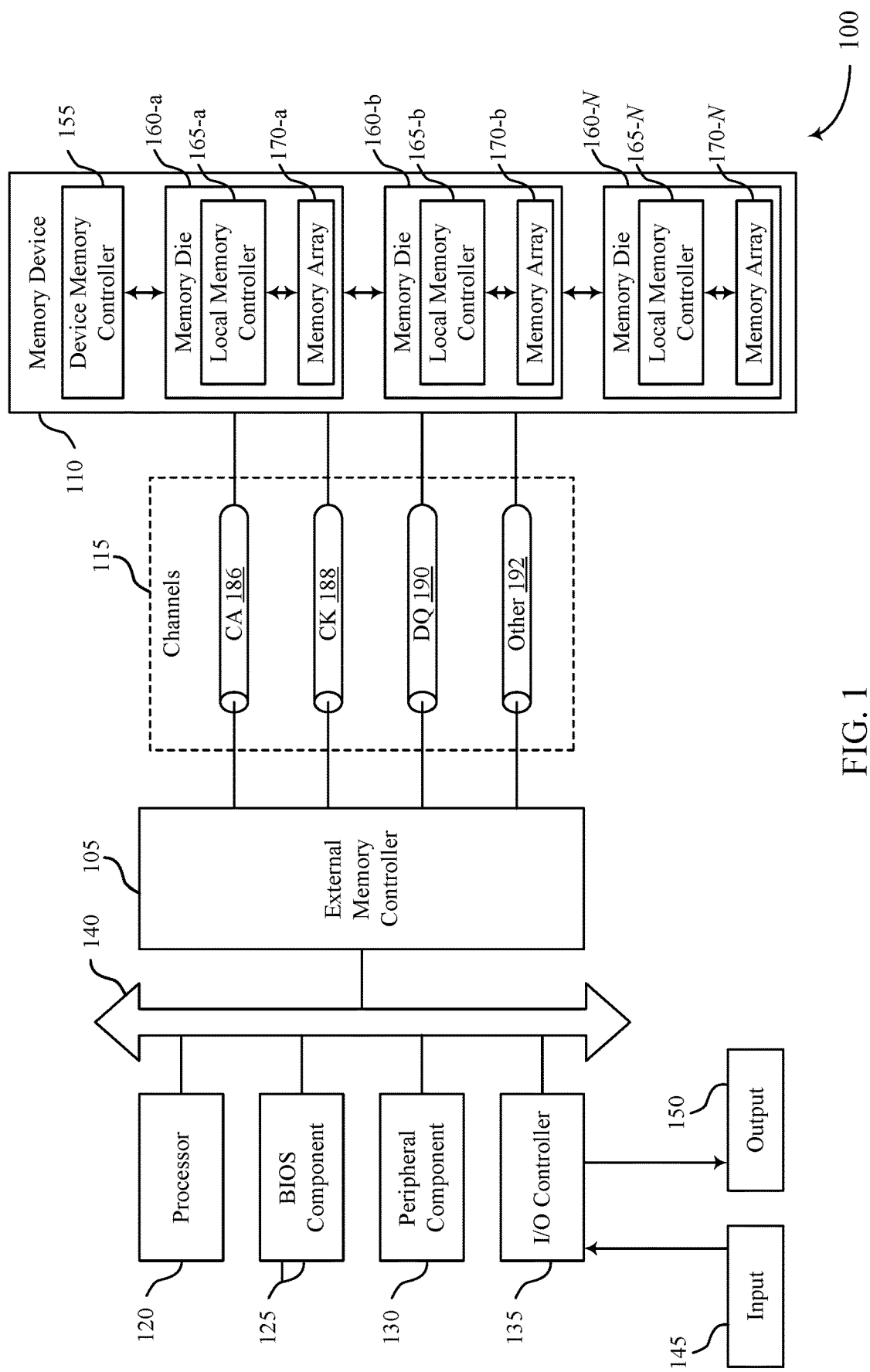
FIG. 1 illustrates aspects of an exemplary system that utilizes one or more memory devices that support adapting the current on a channel as disclosed herein.

Information may be communicated from one electronic device to another electronic device in signals composed of a series of voltage levels each representing a logic value. In some cases, each of the voltage levels may be communicated for a designated time period (e.g., a sampling period). In some examples, the amount of information communicated within each time period (or the information rate) may be increased by signaling additional voltage levels that may represent m-bit logic values, which may also be referred to as multi-level signaling.

In some cases, the information may be communicated between the electronic devices by transmitting the signals over a channel associated with the electronic devices. Transmitting the signals may include applying the series of voltage levels to the channel. When a voltage level is applied to the channel, a voltage of the channel may transition from a first, previous voltage level to the second, applied voltage level. The rate at which the voltage of the channel transitions from the previous voltage level to the present voltage level may be referred to as the "slew rate." The higher the slew rate, the faster the voltage of the channel may transition from one voltage level to another voltage level.

In some cases, when a voltage level is applied to the channel, a voltage of the channel located near a transmitting device transitions from a previous voltage level toward the applied voltage level at a first rate. But characteristics of the channel may cause a voltage of the channel located near a receiving device to transition at a slower rate than the first rate. This decreased transition rate in the channel voltage near a receiving device may result in increased read/write errors or decreased throughput—e.g., if a sampling period is increased to accommodate the delay.

To increase the transition rate of the channel near the receiving device, a current of the channel may be adapted when a new voltage level is applied to the channel. For example, additional current may be injected into the channel when the voltage of the channel transitions from a previous voltage level to a second, higher voltage level.

In some cases, the effects of decreased channel voltage transition rates near a receiving device may become more pronounced as additional voltage levels are transmitted over a channel—e.g., due to varying transition delays between the different voltage levels. To accommodate the varying channel voltage transition rates associated with multi-level signaling, a current of a channel may be adapted based on a difference between a first logic value corresponding to a first voltage level previously applied to channel and a second logic value corresponding to a second voltage level that is currently applied to the channel. For example, an amount of current adapted on a channel (e.g., an increase or decrease in the current on the channel) may be based on a difference between the first logic value and the second logic value.

Features of the disclosure are described below in the context of a memory system in FIGS. 1 and 2. Features of the disclosure are described in the context eye diagrams and circuit diagrams FIGS. 3 through 6B. These and other features of the disclosure are further illustrated by and described with reference to FIGS. 7 and 8, which include an apparatus diagram and flowcharts that relate to adapting the current on a channel.

FIG. 1 illustrates aspects of an exemplary system that utilizes one or more memory devices that support adapting the current on a channel as disclosed herein.

The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 may be configured for bi-directional wireless communication with other systems or devices using a base station or access point. In some examples, the system 100 may be capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 may be a graphics card. The host device may include a plurality of drivers and a plurality of channels 115 linking the host device with the memory device 110.

In some cases, a memory device 110 may be an independent device or component that may be configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice 160 may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components as understood by persons of ordinary skill in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input device 145 may represent a device or signal external to the system 100 that may provide information, signals, or data to the system 100 or its components. This may include a user interface or interface with or between other devices. In some cases, the input device 145 may be a peripheral that interfaces with system 100 via one or more peripheral components 130 or may be managed by the I/O controller 135.

The output device 150 may represent a device or signal external to the system 100 configured to receive an output from the system 100 or any of its components. Examples of the output device 150 may include a display, audio speakers, a printing device, or another processor on printed circuit board, and so forth. In some cases, the output device 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device 110 may include a single memory die 160. A 3D memory device 110 may include two or more memory dice 160 (e.g., memory die 160-a, memory die 160-b, and/or any quantity of memory dice 160-N). In a 3D memory device 110, a plurality of memory dice 160-N may be stacked on top of one another. In some cases, memory dice 160-N in a 3D memory device 110 may be referred to as decks, levels, layers, or dies. A 3D memory device 110 may include any quantity of stacked memory dice 160-N (e.g., two high, three high, four high, five high, six high, seven high, eight high). This may increase the quantity of memory cells that may be positioned on a substrate as compared with a single 2D memory device 110, which in turn may reduce production costs, or increase the performance of the memory array, or both. In some 3D memory device 110, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as disclosed herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170). Drivers, receivers, or both may be used to communicate signals across the channels 115. In some cases, the reference voltages and/or sampling timings of the receivers may be adjusted (e.g., tuned) to improve the communication across conductive lines.

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (e.g., DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of an M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return to zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, external memory controller 105 may transmit information over channel 115 for storage at memory device 110. External memory controller 105 may use multi-level signaling techniques, such as PAM4 signaling. In some cases, a voltage at an end of a channel may not increase as quickly as a voltage applied to a beginning of the channel (e.g., due to inherent resistance and capacitance of the channel). This delay in reaching the applied voltage (or "transition duration") may result in a degraded data eye and increased read/write errors and/or a decreased data rate if a time between signaling PAM4 symbols is increased to accommodate the delay. In some cases, the transition duration at an end of a channel may depend on a change in voltage between successive symbols (e.g., PAM4 symbols). For instance, larger voltage changes may result in increased transition durations.

In some cases, external memory controller 105 may adjust a current of a channel when a symbol is communicated across the channel. For instance, external memory controller 105 may increase or decrease a current on a channel to accelerate a rise or fall of a voltage on the channel. In some cases, external memory controller 105 may adjust the current of the channel based on a change in consecutive symbols, which may be PAM4 symbols in some cases. For instance, external memory controller 105 may push more current to a channel if the change in symbols is greater (e.g., if a first symbol represents logic 00 and a second symbol represents logic 11) than if a smaller change in 4 symbols occurs (e.g., if a first symbol represents logic 10 and a second symbol represents logic 11), as one example.

Figure 2:
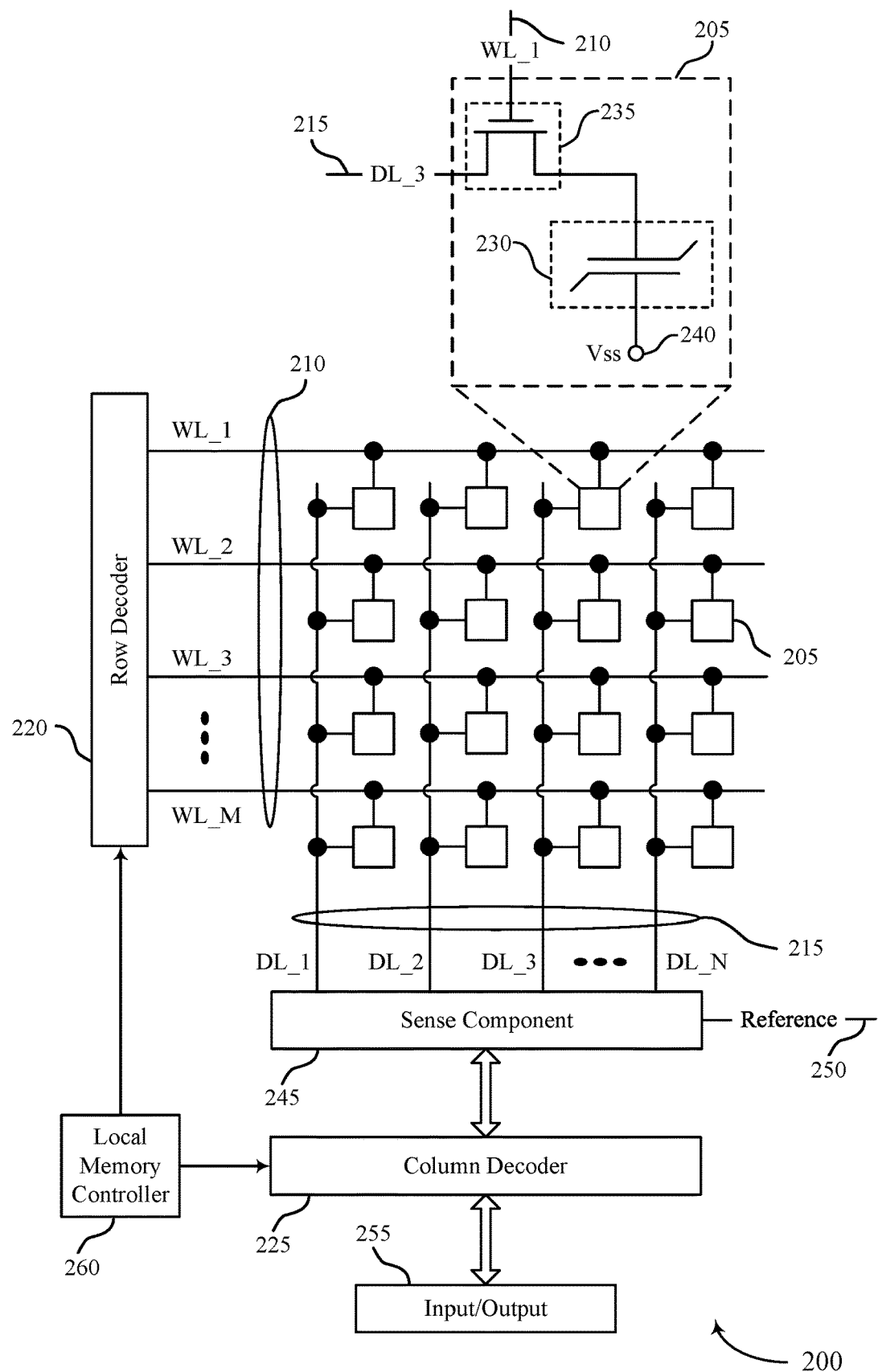
FIG. 2 illustrates aspects of an exemplary memory die that supports adapting the current on a channel as disclosed herein.

FIG. 2 illustrates aspects of an exemplary memory die 200 that supports adapting the current on a channel as disclosed herein.

The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor 230. In DRAM architectures, a memory cell, such as memory cell 205, may include a capacitor 230 that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor 230 of the memory cell 205 and the memory cell 205 may not include a switching component 235.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor 230 of the target memory cell 205. The local memory controller 260 may perform a re-write operation or a refresh operation to return the memory cell 205 to its original logic state. The local memory controller 260 may re-write the logic state to the target memory cell 205 after a read operation. In some cases, the re-write operation may be considered part of the read operation. Additionally, activating a single access line, such as a word line 210, may disturb the state stored in some memory cells 205 in electronic communication with that access line. Thus, a re-write operation or refresh operation may be performed on one or more memory cells 205 that may not have been accessed.

As discussed herein, voltage of a channel for communicating information between memory die 200 and an external memory controller may rise at a slower rate than a voltage applied to the channel. For some modulation schemes, such as PAM4 signaling, larger voltage transitions may result in additional and inconsistent delays and may further degrade an output 255, resulting in increased read and/or write errors to memory die 200.

Figure 3:
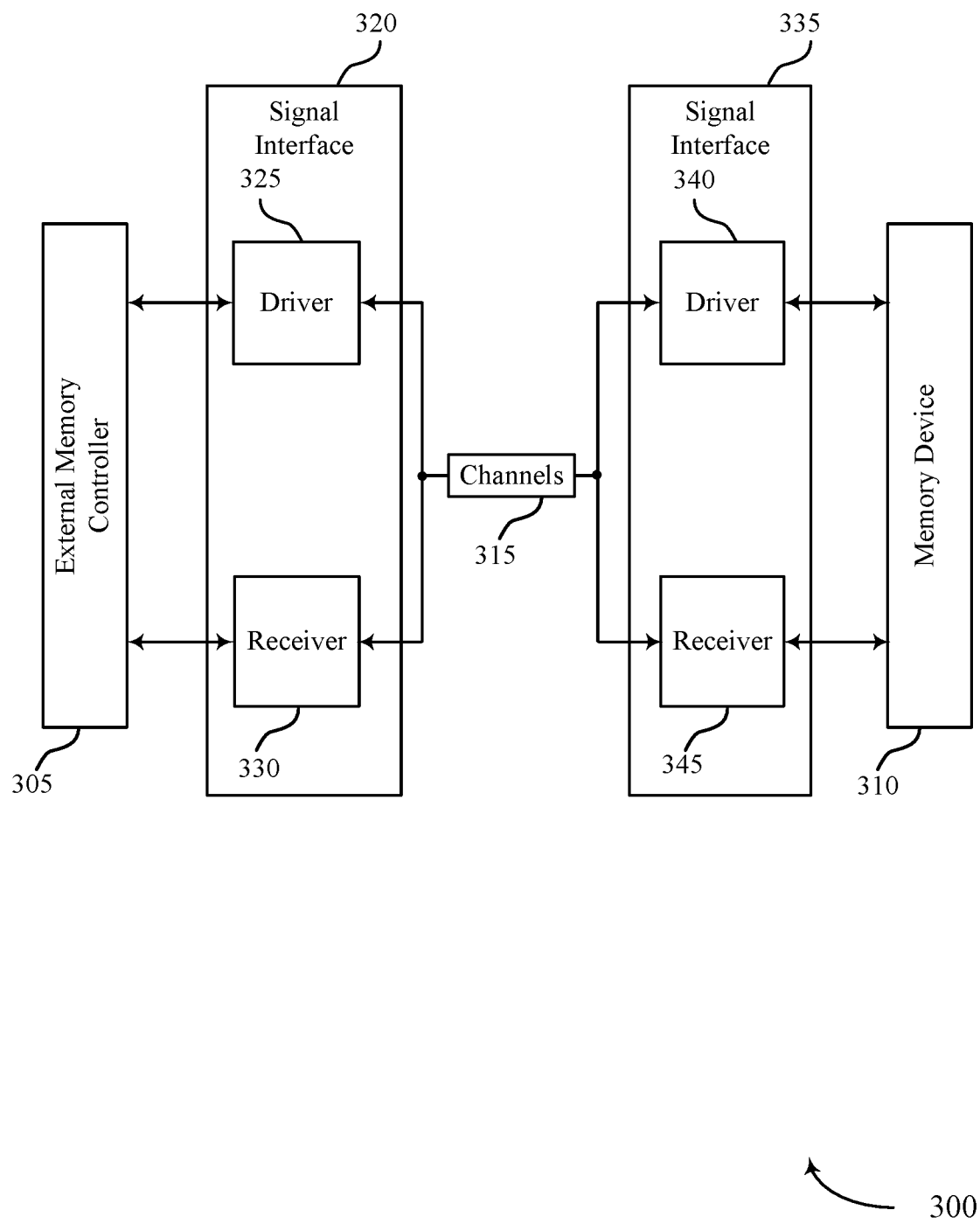
FIG. 3 illustrates aspects of an exemplary memory system that supports adapting the current on a channel as disclosed herein.

FIG. 3 illustrates aspects of an exemplary memory system 300 that supports adapting the current on a channel as disclosed herein.

Memory system 300 may include external memory controller 305, memory device 310, channels 315, first signal interface 320, and second signal interface 335. External memory controller 305, channels 315, and memory device 310 may be examples of aspects of external memory controller 105, channels 115, and memory device 110 or memory die 200 of FIGS. 1 and 2, respectively.

First signal interface 320 may generate and/or decode signals communicated using the plurality of channels 315. First signal interface 320 may be associated with each component that is coupled with channels 315. First signal interface 320 may be configured to generate and/or decode multi-level signals, binary signals, or both (e.g., simultaneously). In some cases, first signal interface 320 may be included within external memory controller 305.

In some cases, first signal interface 320 may be configured to selectively generate and/or decode different types of signals (e.g., NRZ signals, PAM4 signals, PAM8 signals, etc.). Different types of signals may be used based on the operational circumstances of the memory system 300. For example, binary signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof.

In some cases, first signal interface 320 may be configured to implement coding functions such as error detection procedures, error correction procedures, data bus inversion procedures, or combinations thereof. First signal interface 320 may include first driver 325 and first receiver 330.

First driver 325 may be configured to generate a multi-level signal based on a logic state that includes multiple bits. For example, first driver 325 may use PAM signaling techniques to generate a signal having an amplitude that corresponds to the logic state. First driver 325 may be configured to receive data using a single input line. In some cases, first driver 325 may include a first input line for a first bit of data (e.g., most-significant bit) and a second input line for a second bit of data (e.g., least-significant bit). In some circumstances, first driver 325 may be configured to generate a binary signal (e.g., an NRZ signal). In some examples, first driver 325 may be referred to as a multi-leg driver. In some examples, first driver 325 includes an operational amplifier.

First receiver 330 may be configured to determine a logic state represented by the multi-level signal received using the plurality of channels 315. First receiver 330 may determine an amplitude of the received multi-level signal. Based on the determined amplitude, first receiver 330 may determine the logic state represented by the multi-level signal. First receiver 330 may be configured to output data using a single output line. In some cases, first receiver 330 may include a first output line for a first bit of data (e.g., most-significant bit) and a second output line for a second bit of data (e.g., least-significant bit). In some circumstances, first receiver 330 may be configured to decode a binary signal (e.g., an NRZ signal).

Second signal interface 335 may be similarly configured to and operate similarly as first signal interface 320. In some cases, second signal interface 335 may be included in memory device 310. Second signal interface 335 may include second driver 340 and second receiver 345. In some cases, second driver 340 and second receiver 345 may be similarly configured to and operate similarly as first driver 325 and first receiver 330.

As discussed herein, information may be communicated from one electronic device to another by transmitting a signal including a series of voltages that are representative of binary logic values. For example, first driver 325 may transmit a high voltage to communicate a first logic value (e.g., logic 1) and a low voltage to communicate a second logic value (e.g., logic 0) to second receiver 345. In some examples, a series of high and low voltages (e.g., eight voltage pulses) may be transmitted to communicate a corresponding series of logic values (e.g., eight logic values) that form an n-bit binary word (e.g., an eight-bit binary word, such as "00101001").

In some cases, each of the voltages may be transmitted for a certain period of time. For example, a driver may transmit a signal having a high voltage to channel 315 to communicate a first logic value, where the high voltage may be applied for a duration that is suitable for second receiver 345 to receive and identify a voltage level of the signal.

In some cases, the amount of information communicated within each period of time (or the information rate) may be increased by signaling additional voltage levels that are each correlated with an m-bit logic value. For example for a communication scheme using four voltage levels (e.g., PAM4), a first voltage level may be representative of a first logic value (e.g., logic 00), a second voltage level may be representative of a second logic value (e.g., logic 01), third voltage level may be representative of a third logic value (e.g., logic 10), and a fourth voltage level may be representative of a fourth logic value (e.g., logic 11). In some cases, by associating two information bits with each voltage level, twice as much information may be communicated in a same time period as when a single information bit is associated with the voltage level.

In some cases, a voltage may be applied to a channel by a transmission driver, such as first driver 325, that is configured to have a high slew rate. A slew rate may be represented by the equation $$\left(\frac{\Delta V}{t_{\Delta V}}\right),$$

where ΔV (or "the voltage change") may be the difference between a first voltage ($V_1$) and a second voltage ($V_2$), and where $t_{\Delta V}$ (or "the transition period") may be the period the amount of time needed for the first voltage to transition to the second voltage. The slew rate of a transmission driver may be determined based on the time it takes for the transmission driver to switch from outputting one voltage to outputting another voltage. The higher the configured slew rate, the quicker a transmission driver may switch from one voltage to another voltage. Also, for a same slew rate, a larger voltage change will result in a longer the transition period.

When a voltage is applied to the channel, a voltage of a portion of the channel (located near the transmission driver, for example) may transition from one voltage toward the applied voltage based on the slew rate of the transmission driver. For example, the slew rate of the channel voltage located near first driver 325 may be equivalent or nearly equivalent to the slew rate of first driver 325. But an impedance of the channel may cause the slew rate of the channel voltage (e.g., near second receiver 345) to be significantly different than (e.g., slower than) the slew rate of first driver 325.

To increase the slew rate of a channel near the receiver, a current of the channel may be adapted (e.g., increased or decreased) while a voltage is applied to the channel. For example, before or when a voltage is being applied to the channel by a transmission driver, an additional current may be applied to the channel (e.g., using a current source). The application of the additional current may cause additional charge to build on the channel, and as a result, the voltage of the channel may increase at a faster rate than if the voltage alone was applied to the channel.

In some cases, an adaptive driver may be included in a transmission circuit and configured to adapt the current of the channel. For example, an adaptive driver may be included as part of the transmission circuit so that an output of the adaptive driver may be in parallel with an output of the transmission driver and so that both outputs are coupled with the channel. The adaptive driver may be configured to inject current (or add charge) into the channel while the transmission driver applies a voltage to the channel. By adapting the current on the channel (e.g., by injecting current or adding charge) while the transmission driver applies a voltage to the channel, the voltage of the channel may switch from a previously applied voltage to the currently applied voltage in less time (e.g., with a faster slew rate) than if just the transmission driver applied the voltage.

As described herein, when multiple voltage levels are transmitted over a channel, the period for transitioning between one voltage and another voltage may depend on the magnitude of the voltage change. For instance, a transition period for a transmission of a first voltage and a second voltage may be shorter than a transition period for a transmission of the first voltage and a third voltage—e.g., when the third voltage is larger than the second voltage. In some cases, a timing for communicating information may increase to accommodate the longer transition duration of the larger voltage differences, reducing throughput. In other cases, a sensing window may become degraded—e.g., may result in a "collapsed" data eye (an eye diagram is discussed in more detail herein and with respect to FIG. 4)—increasing a bit error rate of communications.

To avoid increasing the communication timing and/or corrupting the sensing window when utilizing multi-level signaling, a magnitude of a slew rate of a channel voltage may be increased by adapting a current of the channel during a transition period of the channel.

For example, before or while a voltage of the channel transitions from one voltage level to another voltage level, an additional (e.g., external) current may be applied to the channel. The application of the additional current may cause additional charge to build up on the channel during the transition period, and as a result, the voltage of the channel may increase at a faster rate than if the current were not applied to the channel.

In some case, an adaptive driver may be included in the transmission circuit so that an output of the adaptive driver is in parallel with an output of the transmission driver and so that both outputs are coupled with the channel. The adaptive driver may be configured to inject current (or add charge) into the channel while the transmission driver applies a voltage to the channel. By adapting the current on the channel while the transmission driver applies a voltage to the channel for each voltage transition, the voltage of the channel may switch from a previously applied voltage to the currently applied voltage in less time for each voltage transition.

To avoid increasing the communication timing and/or corrupting the sensing window when utilizing multi-level signaling while also conserving energy, the slew rate of the channel voltage may be adaptively increased based on a change in voltage levels and/or corresponding logic values.

For example, an amount of external current applied to a channel may be based on a difference between a first voltage previously applied to the channel and representative of a first logic value and a second voltage currently applied to the channel and representative of a second logic value. For instance, a first amount of current may be injected into the channel for a first difference (which may be determined by one or more components) between the first voltage and the second voltage is and a second amount of current may be injected into the channel for a second difference (which may be determined by one or more components) between a third voltage and a second voltage, where the second amount may be larger than the first amount when the second difference is larger than the first difference.

In some cases, an adaptive driver may be included in the transmission circuit so that an output of the adaptive driver is in parallel with an output of the transmission driver and so that both outputs are coupled with the channel. The adaptive driver may be configured to inject current (or add charge) into the channel while the transmission driver applies a voltage to the channel. In some cases, a change detection circuit may also be included in the transmission circuit and configured to detect a change or upcoming change in a voltage applied to the channel. In some cases, the change detection circuit may detect a magnitude of the voltage change by calculating a difference between a first logic value associated with a voltage currently being applied to the channel and a second logic value associated with an upcoming voltage to be applied to the channel.

Figure 4:
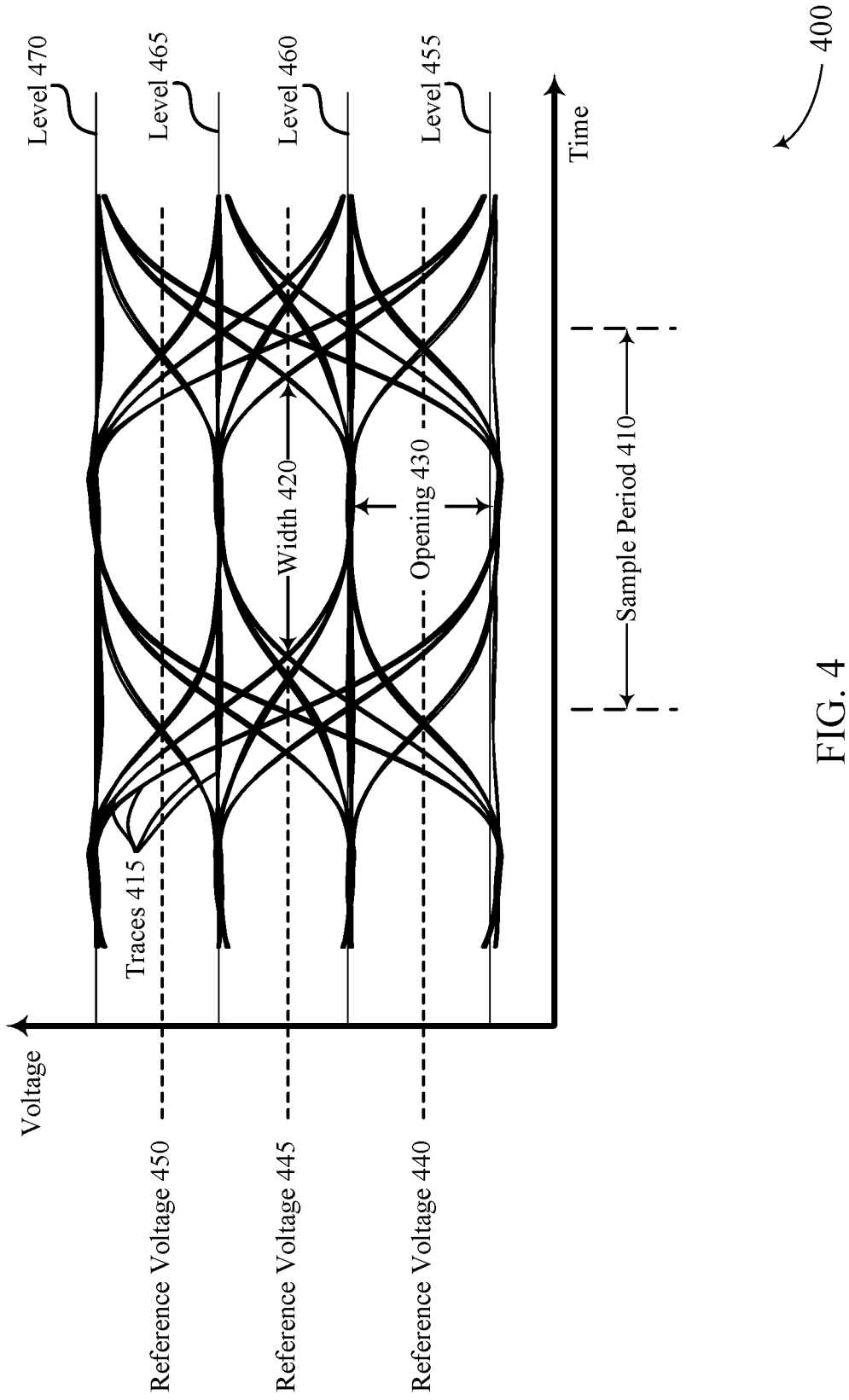
FIG. 4 illustrates aspects of an exemplary diagram for adapting the current on a channel as disclosed herein.

FIG. 4 illustrates aspects of an exemplary eye diagram 400 for adapting the current on a channel as disclosed herein.

Eye diagram 400 may depict overlaid data transmissions and may illustrate implementation of aspects of system 100 and memory die 200 described with reference to FIGS. 1 and 2. In some examples, eye diagram 400 may represent a signal modulated according to a scheme that includes three or more voltage levels, such as voltage levels 455 to 470 (e.g., a multi-level signal).

Eye diagram 400 may be used to indicate the quality of signals in high-speed transmissions and may represent four symbols of a signal (e.g., '00', '01', '10', and '11'). In some examples, each of the four symbols may be represented by a different voltage amplitude (e.g., first voltage level 455, second voltage level 460, third voltage level 465, and fourth voltage level 470). In other examples, eye diagram 400 may represent a PAM signal (e.g., a PAM4 signal) that may be used to communicate data in a memory device (such as a memory device 110 as described with reference to FIG. 1). Eye diagram 400 may be used to provide a visual indication of the health and integrity of a signal, and may further indicate noise margins of the data signal. The noise margin may, for example, refer to an amount by which the signal exceeds the ideal boundaries of the levels 405. In the present example, eye diagram 400 illustrates four distinct voltage levels 455 to 470 or symbols that may be communicated (e.g., across a conductor), for example, using PAM4 signaling.

To generate eye diagram 400, an oscilloscope or other computing device may sample a digital signal according to a sample period 410 (e.g., a unit interval or a bit period). The sample period 410 may be defined by a clock associated with the transmission of the measured signal. In some examples, the oscilloscope or other computing device may measure the voltage level of the signal during the sample period 410 to form a trace 415. Noise and other factors may result in the traces 415 measured from the signal deviating from a set of ideal step functions. By overlaying multiple traces 415, various characteristics about the measured signal may be determined. For example, eye diagram 400 may be used to identify different characteristics of a communication signals such as jitter, cross talk, distortion, electromagnetic interference (EMI), signal loss, signal-to-noise ratio (SNR), other characteristics, or combinations thereof. A closed eye may indicate a noisy and/or unpredictable signal.

An 'eye' of eye diagram 400 may refer to the space between the traces 415 and may include a width, such as width 420, and an opening, such as opening 430. As the signals converge toward one of the multiple voltage levels 455 through 470, the areas between the voltage levels 455 through 470 that are devoid of traces 415 may thus be referred to as eyes of eye diagram 400. Each eye in an eye diagram may have a unique width 420 based on the characteristics of the measured signal. Various encoding and decoding techniques may be used to modify width 420 of the measured signal.

To distinguish between the different voltage levels 455 through 470 when decoding a signal, respective reference voltages 440 through 450 may be located between the different voltage levels 455 through 470 represented by the traces 415. For example, low-level reference voltage 440 may be positioned between first voltage level 455 and second voltage level 460; mid-level reference voltage 445 may be positioned between second voltage level 460 and third voltage level 465; and high-level reference voltage 450 may be positioned between the third voltage level 465 and fourth voltage level 470. When decoding, the signals represented by the traces 415 may be compared to the reference voltages 440 to 450 at a sampling time that may occur near the middle of sample period 410. The smaller the eye associated with each reference voltage, the more likely that errors may be introduced into the detection. As such, the receiver may ideally use a minimum voltage difference (with respect to one of reference voltages 440 through 450) to distinguish whether a particular signal is higher or lower than the one of the reference voltages 440 through 450.

But in reality, the data eye may be smaller, for example, due to cross coupling, noise, unstable voltages, and the like. An error (e.g., an incorrect value) may thus be detected if a signal meant to convey first voltage level 455 settles above low-level reference voltage 440 or inadvertently crosses above low-level reference voltage 440 when a sampling time occurs. As a result, the receiver may determine that second voltage level 460 was signaled, when in fact, first voltage level 455 was signaled.

As discussed herein, larger voltage level transitions are associated with longer rise and fall times for a channel voltage. For example, a transition from first voltage level 455 to fourth voltage level 470 may take longer than a transition from first voltage level 455 to second voltage level 460. In some cases, the duration of sample period 410 is based on the longest rise and/or fall times between voltage levels—e.g., sample period 410 may be increased to accommodate longer rise and/or fall times. Increasing sample period 410 may reduce throughput of a memory system, and if sample period 410 is not lengthened, increasing read/write errors may occur.

As discussed herein, adapting a current of a channel during a transition period may increase a slew rate of the channel and expand the data eyes in eye diagram 400—e.g., may increase the widths and opening of the data eyes. As discussed herein, an amount of current injected into a channel during a positive voltage level transition or an amount of current removed from a channel during a negative voltage level transition may be based on a magnitude of the voltage level transition. That is, more current may be injected into the channel when the channel voltage transitions from first voltage level 455 to fourth voltage level 470 than when the channel voltage transitions from second voltage level 460 to third voltage level 465.

Figure 5A:
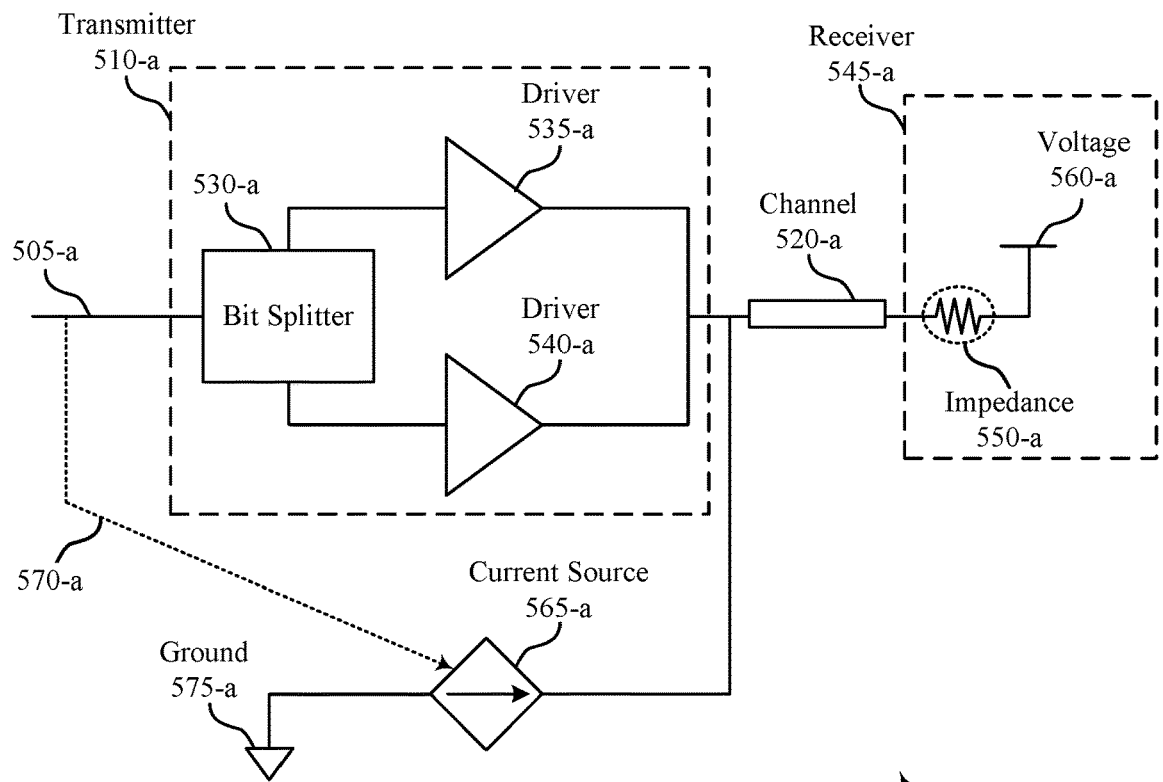
FIGS. 5A and 5B illustrate aspects of an exemplary memory system that supports adapting the current on a channel as disclosed herein.

FIG. 5A illustrates aspects of an exemplary memory system that supports adapting the current on a channel as disclosed herein.

Memory system 500-a may be configured to communicate multi-level signaling between devices and may be an example of aspects of system 100, memory die 200, or memory system 300 of FIGS. 1-3. Memory system 500-a may include input line 505-a, transmission circuit 510-a, channel 520-a, receiver 545-a, current source 565-a, ground reference 575-a, and link 570-a.

Input line 505-a may be configured to carry voltages that are representative of one or more bits of information. For example, a first voltage applied to input line 505-a may represent a first bit of information (e.g., logic value 1) and a subsequent voltage applied to input line 505-a having a different magnitude than the first voltage may represent a second bit of information (e.g., logic value 0). In some examples, a voltage applied to input line 505-a may represent multiple bits of information—e.g., a first voltage may represent logic value 11. The bits of information conveyed over input line 505-a may be referred to as a "bit stream."

In some cases, input line 505-a may be configured to communicate single bits of information in a serial fashion—e.g., input line 505-a may be used to communicate one information bit at a time. In other cases, input line 505-a may be configured to communicate multiple bits of information in a parallel—e.g., input line 505-a may be used to communicate multiple information bits at a time. And in some cases, input line 505-a may be further configured to communicate bits of information in a serial fashion—e.g., input line 505-*a* may be used to communicate one set of information bits at a time. In some cases, input line 505-*a* may communicate multiple information bits using multiple conductive traces—e.g., by transmitting a first voltage representing a first information bit over a first conductive trace, a second voltage representing a second information bit over a second conductive trace, and so on. In some examples, the transmission of a voltages representing bits of information may be referred to as the transmission of information bits. Thus, input line 505-*a* may be configured to deliver information bits to transmission circuit 510-*a*.

Transmission circuit 510-*a* may be configured to receive and process the voltages transmitted over input line 505-*a*. Transmission circuit 510-*a* may be further configured to process the received voltages based on the information bits represented by the voltage. For example, transmission circuit 510-*a* may be configured to identify multi-bit logic values based on the received stream of information bits—e.g., transmission circuit 510-*a* may combine adjacent, non-overlapping information bits to form multi-bit logic values. After identifying the multi-bit logic values, transmission circuit 510-*a* may be further configured to generate an output voltage corresponding to the identified multi-bit logic values and to transmit the output voltage over a channel, such as channel 520-*a*. Transmission circuit 510-*a* may include bit splitting component 530-*a*, first driver 535-*a*, and second driver 540-*a*.

Bit splitting component 530-*a* may be configured to identify multi-bit logic values in a bit stream and to separate the multi-bit logic values into single bit logic values. In some cases, bit splitting component 530-*a* may be configured to split a logic value into a Most Significant Bit (MSB) and a Least Significant Bit (LSB). For example, if bit splitting component 530-*a* receives the following sequence of single-bit logic values over input line 505-*a* (chronologically from left to right): {01011010}, bit splitting component 530-*a* may separate the bits into the following multi-bit logic values: {01}; {01}; {10}; {10}. Bit splitting component 530-*a* may then process the first multi-bit logic value, further separating the first multi-bit logic value into single bit logic values {0} and {1}, where logic value 0 is the MSB of the first multi-bit logic value and logic value 1 is the LSB of the first multi-bit logic value. Once a multi-bit logic value has been separated into single bit logic values, bit splitting component 530-*a* may then communicate the single bit logic values to drivers in transmission circuit 510-*a*, such as first driver 535-*a* and second driver 540-*a*. In some cases, bit splitting component 530-*a* may communicate (e.g., concurrently, simultaneously) the single bit logic values to the drivers in transmission circuit 510-*a*. In some cases, communicating the single bit logic values to the drivers may include transmitting one or more voltages representative of the single bit logic values.

First driver 535-*a* may be configured to output a particular voltage based on a single bit logic value communicated to first driver 535-*a*. For example, first driver 535-*a* may be configured to output a first voltage (e.g., a high voltage) if a first voltage (e.g., a high voltage) representative of a first logic value (e.g., logic value 1) is received. Alternatively, first driver 535-*a* may be configured to output a second voltage (e.g., a low voltage) if a first voltage (e.g., a low voltage) representative of a first logic value (e.g., logic value 0) is received. First driver 535-*a* may be configured to have a first slew rate and may transition from a first voltage to a second voltage within a certain period of time based on the first slew rate. First driver 535-*a* may also be configured to have a first output impedance. The output voltage of first driver 535-*a* may be applied to a channel, such as channel 520-*a*.

Second driver 540-*a* may be similarly configured to first driver 535-*a* and may be configured to output a particular voltage based on a different single bit logic value communicated to second driver 540-*a*. Second driver 540-*a* may be configured to have a second slew rate and may transition from a first voltage to a second voltage within a certain period of time based on the second slew rate. In some cases, a value of the first and second slew rates are closely matched or the same. Second driver 540-*a* may be configured to have a second output impedance. The output voltage of second driver 540-*a* may be applied to the same channel (e.g., channel 520-*a*) as the output voltage of first driver 535-*a*.

In some cases, the output voltages of first driver 535-*a* and second driver 540-*a* may be concurrently or simultaneously applied to channel 520-*a*. The different combination of voltages output by first driver 535-*a* and second driver 540-*a* may result in different voltage levels being applied to channel 520-*a*. For example, if first driver 535-*a* outputs a high voltage and second driver 540-*a* outputs a high voltage, then a first voltage level may be applied to channel 520-*a*, if first driver 535-*a* outputs a high voltage and second driver 540-*a* outputs a low voltage, then a second voltage level may be applied to channel 520-*a*, if first driver 535-*a* outputs a low voltage and second driver 540-*a* outputs a high voltage, then a third voltage level may be applied to channel 520-*a*, and if first driver 535-*a* outputs a low voltage and second driver 540-*a* outputs a lows voltage, then a fourth voltage level may be applied to channel 520-*a*, where the first voltage level may be the highest voltage level, the second voltage level may be the second highest voltage level, and so on.

In some cases, the voltage level applied to channel 520-*a* may be based on an output impedance of first driver 535-*a* and second driver 540-*a*. In some cases, first driver 535-*a* is configured to have a first output impedance and second driver 540-*a* is configured to have a second output impedance. In some cases, the first output impedance and the second output impedance are based on a termination impedance, such as termination impedance 550-*a*. For instance, a value of the first output impedance and a value of the second output impedance may be selected so that a value of the parallel impedance of the first output impedance and the second output impedance is equivalent to the termination impedance—e.g., for a termination impedance of 40 ohms, the first output impedance may be 60 ohms and the second output impedance may be 120 ohms.

In some case, the combined slew rate of first driver 535-*a* and second driver 540-*a* may be based on the first slew rate of first driver 535-*a* and the second slew rate of second driver 540-*a*. In some cases, the combined slew rate may depend on the inputs to first driver 535-*a* and second driver 540-*a*. For instance, a value of the combined slew rate may be increased when both first driver 535-*a* and second driver 540-*a* are outputting a high voltage relative to when one of first driver 535-*a* and second driver 540-*a* are outputting a high voltage.

Channel 520-*a* may be configured to communicate, to receiver 545-*a*, a voltage representative of a multi-bit logic value based on the output of transmission circuit 510-*a*. In some cases, a voltage level of channel 520-*a* may be based on an output of first driver 535-*a* and an output of second driver 540-*a*.

Receiver 545-*a* may be configured to sense a voltage level of channel 520-*a* and to identify a logic state corresponding to the voltage level. Receiver 545-*a* may include a voltage source 560-*a* and a termination impedance 550-*a*. In some cases, the voltage level of channel 520-*a* is based on a magnitude of voltage source 560-*a*.

In some cases, a voltage at the beginning of channel 520-*a* (e.g., near transmission circuit 510-*a*) may rise and fall at a different rate than a voltage at the end of channel 520-*a* (e.g. near receiver 545-*a*). For example, an inherent capacitance and an inherent resistance of channel 520-*a* may cause the voltage at the end of channel 520-*a* to rise or fall at a slower rate than a voltage applied at the beginning of channel 520-*a*. This delayed response at the end of channel 520-*a* may be reflected in an output (e.g., related to an eye diagram, such as eye diagram 400 of FIG. 4). In some cases, a more pronounced delay in the response results in a narrowed or collapsed data eye.

To mitigate the delayed response and to open a data eye of an eye diagram, additional current (or charge) may be injected into channel 520-*a* when an output voltage of transmission circuit transitions from one voltage to another. For instance, a current source, such as current source 565-*a*, may be introduced into memory system 500-*a* and configured to apply a current to channel 520-*a* in addition to the current supplied to channel 520-*a* by transmission circuit 510-*a*. In some examples, current source 565-*a* may generate a current that adds or removes charge from channel 520-*a* based on a bit stream communicated over input line 505-*a*.

In some cases, current source 565-*a* may generate a current based on a difference between a first multi-bit logic value and a second multi-bit logic value communicated over input line 505-*a*, as represented by link 570-*a*. For example, if logic value 00 is followed by logic value 11, current source 565-*a* may inject a larger amount of current into channel 520-*a* than if logic value 00 is followed by logic value 01. Similarly, if logic value 11 is followed by logic value 00, current source 565-*a* may remove a larger amount of current from channel 520-*a* than if logic value 11 is followed by logic value 10. In some examples, current source 565-*a* may be in electronic communication with a ground reference 575-*a*. In some cases, ground reference 575-*a* is a virtual ground reference.

Link 570-*a* may be configured to communicate information bits and/or comparisons between successive information bits to current source 565-*a*. In some cases, link 570-*a* may be a direct link (e.g., a conductive trace) between input line 505-*a* and current source 565-*a*. In other cases, link 570-*a* may be an indirect link (e.g., a controller may process the information bits and forward information to current source 565-*a* based on the information bits) between input line 505-*a* and current source 565-*a*.

In some cases, the amount of current injected into or removed from channel 520-*a* is based on a received input value or setting. For instance, if current source 565-*a* receives input value {1}, then current source 565-*a* may inject or remove a first amount of current to or from channel 520-*a* depending on whether the voltage of channel 520-*a* is transitioning in a positive or negative direction. Similarly, if current source 565-*a* receives input value {2}, then current source 565-*a* may inject or remove a second amount of current to or from channel 520-*a*. And so on.

In some cases, current source 565-*a* may be included within transmission circuit 510-*a*. In some examples, a magnitude of a current generated by current source 565-*a* may be based on a change in a voltage level near transmission circuit 510-*a* instead of logic values received over input line 505-*a*. In some examples, a duration during which current source 565-*a* adapts a current of channel 520-*a* occurs within a transition period of channel 520-*a* to avoid disturbing the final voltage level of channel 520-*a*—e.g., the adaptation of the current on channel 520-*a* may be completed before channel 520-*a* reaches a currently signaled voltage level.

Although, FIG. 4 generally discusses adapting a current of channel 520-*a* during the transmission of two bit logic values, a current of channel 520-*a* may be similarly adapted for modulation schemes that convey more than two bit logic values, such as PAM8, PAM16, and the like. When more complex modulation schemes are used, transmission circuit 510-*a* may include additional drivers.

Figure 5B:
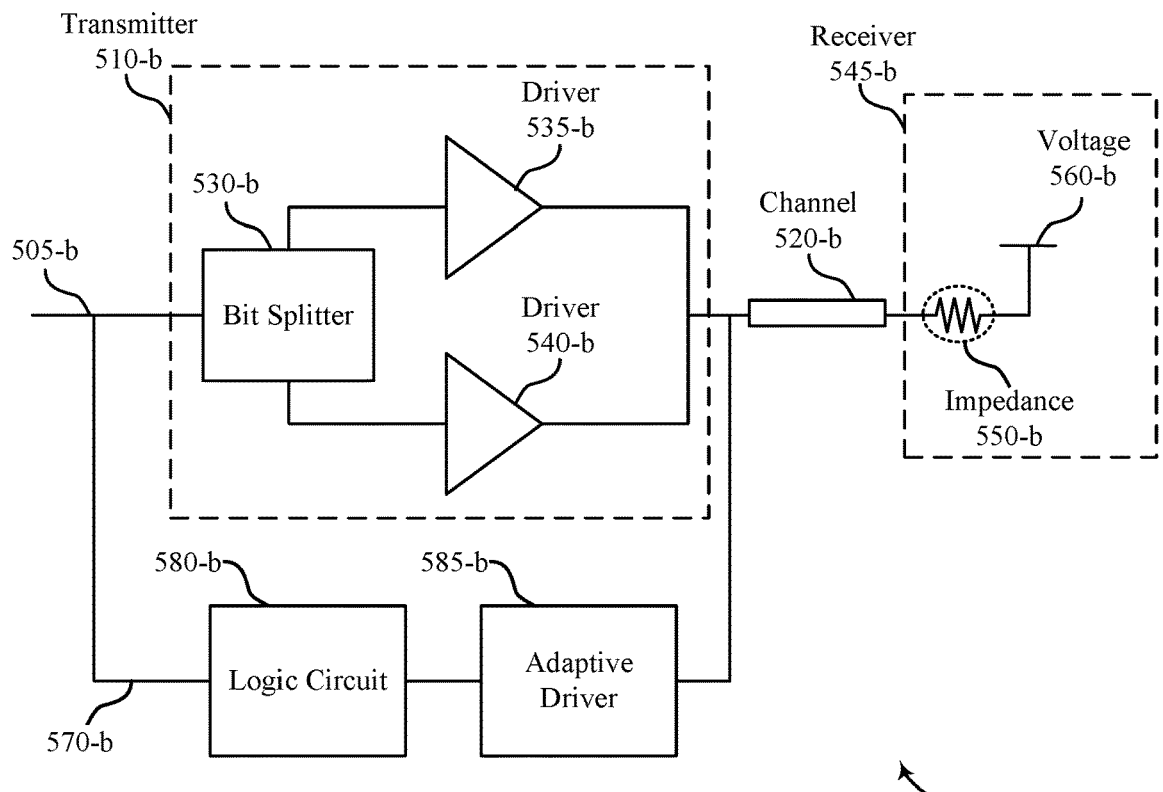

FIG. 5B illustrates aspects of an exemplary memory system that supports adapting the current on a channel as disclosed herein.

Memory system 500-*b* may be an example of aspects of system 100, memory die 200, memory system 300, or memory system 500-*a* of FIGS. 1-3 and 5A. Memory system 500-*b* may include input line 505-*b*, transmission circuit 510-*b*, channel 520-*b*, and receiver 545-*b*, which may be examples of aspects of input line 505-*a*, transmission circuit 510-*a*, channel 520-*a*, and receiver 545-*a* of FIG. 5A, respectively. Memory system 500-*b* may also include logic circuit 580-*b* and adaptive driver 585-*b*.

Transmission circuit 510-*b* may include bit splitting component 530-*b*, first driver 535-*b*, and second driver 540-*b*, which may be examples of aspects of bit splitting component 530-*a*, first driver 535-*a*, and second driver 540-*a* of FIG. 5A. In some cases, logic circuit 580-*b* and adaptive driver 585-*b* may be included within transmission circuit 510-*b*. Receiver 545-*b* may include termination impedance 550-*b* and voltage source 560-*b*, which be examples of aspects of termination impedance 550-*a* and voltage source 560-*a* of FIG. 5A.

In some examples, link 570-*b* establishes a conductive path between input line 505-*b* and logic circuit 580-*b*. Information bits may be communicated over link 570-*b* to logic circuit 580-*b*. In other examples, link 570-*b* may establish a conductive path between bit splitting component 530-*b* and logic circuit 580-*b*. When communicating multiple bits (e.g., in parallel) between logic circuit and input line 505-*b* or bit splitting component 530-*b*, link 570-*b* may include multiple conductive traces.

Logic circuit 580-*b*, which may also be referred to as a change detection circuit, may be configured to identify a change between a first logic value and a second logic value communicated over 505-*b*. For example, logic circuit 580-*b* may be configured to determine a difference between the first logic value and the second logic value, where the second logic value occurs after and adjacent to the first logic value in time. A value of the determined difference may be based on the first and second logic values. For instance, the determined difference may be larger when the change in logic values may be greater. In some cases, particular values may correspond to particular changes between logic values—e.g., a value of {+3} may correspond to a first logic value 00 and a second logic value 11, a value of {+2} may correspond to a first logic value 00 and a second logic value 10, a value of {+1} may correspond to a first logic value 00 and a second logic value 01, a value of {−3} may correspond to a first logic value 11 and a second logic value 00, and the like.

In some examples, logic circuit 580-*b* may receive deconstructed logic values from bit splitting component 530-*b*—e.g., logic circuit 580-*b* may be coupled with an output of bit splitting component 530-*b*. In some examples, logic circuit 580-*b* may include a bit splitting component similar to bit splitting component 530-*b*. Logic circuit 580-*b* may generate an output signal that is representative of the change between the first and second logic values and may communicate the output signal to adaptive driver 585-*b*. An example configuration of logic circuit 580-*b* is discussed in more detail herein and with reference to FIGS. 6A and 6B.

Adaptive driver 585-*b* may be configured to either push current to or pull current from channel 520-*b* based on logic values communicated over input line 505-*b*. For example, adaptive driver 585-*b* may adapt a current of channel 520-*b* based on a signal received from logic circuit 580-*b* that is representative of a change between a first logic value and a second logic value. An example configuration of adaptive driver 585-*b* is discussed in more detail herein and with reference to FIGS. 6A and 6B.

Figure 6A:
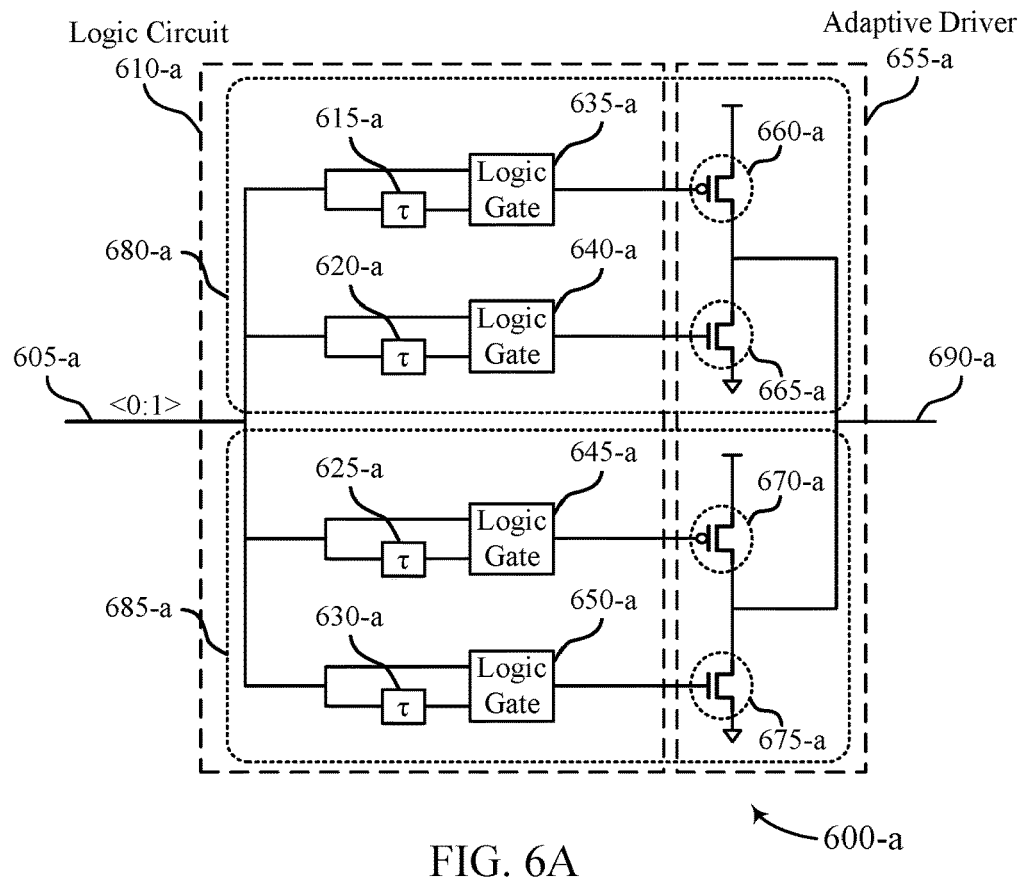
FIGS. 6A and 6B illustrate aspects of an exemplary slew rate enhancement circuit that supports adapting the current on a channel as disclosed herein.

FIG. 6A illustrates aspects of an exemplary slew rate enhancement circuit that supports adapting the current on a channel as disclosed herein.

Slew rate enhancer 600-*a* may be configured to adapt (e.g., increase or decrease) a current on a channel, such as a channel 520 of FIGS. 5A and 5B. Slew rate enhancer 600-*a* may include input line 605-*a*, logic circuit 610-*a*, adaptive driver 655-*a*, and output line 690-*a*.

Input line 605-*a* may be configured to deliver information bits of logic value to logic circuit 610-*a*. In some examples, input line 605-*a* may include multiple conductive traces and may deliver, in parallel, an MSB and an LSB of logic values to logic circuit 610-*a*.

Logic circuit 610-*a* may be configured to generate a signal representative of a change between a first logic value and a subsequent logic value. Logic circuit 610-*a* may receive an MSB and LSB of multiple logic values over input line 605-*a* and may generate a signal corresponding to a change between the MSB and LSB of consecutive logic values. For example for a first change between logic values (e.g., {11} to {00}), logic circuit 610-*a* may generate a first output signal, for a second change between logic values (e.g., {11} to {01}), logic circuit 610-*a* may generate a second output signal, and so on. Logic circuit 610-*a* may communicate a generated output signal to adaptive driver 655-*a*. Logic circuit 610-*a* may include first delay component 615-*a*, second delay component 620-*a*, third delay component 625-*a*, fourth delay component 630-*a*, first logic gate 635-*a*, second logic gate 640-*a*, third logic gate 645-*a*, and fourth logic gate 650-*a*.

First delay component 615-*a* may be configured to delay the application of a signal to first logic gate 635-*a*. In some cases, first delay component 615-*a* may include one or more inverting devices. Second delay component 620-*a*, third delay component 625-*a*, and fourth delay component 630-*a* may similarly be configured to delay the application of a signal to second logic gate 640-*a*, third logic gate 645-*a* and fourth logic gate 650-*a*, respectively.

First logic gate 635-*a* may be configured to generate an output signal based on a current and delayed signals received at the inputs of first logic gate 635-*a*. In some cases, first logic gate 635-*a* may be configured to generate a high output signal when a voltage of the two inputs are equivalent and a low output signal when a voltage of the two inputs are different—e.g., first logic gate 635-*a* may include a not-exclusive-or (XNOR) gate. Second logic gate 640-*a*, third logic gate 645-*a*, and fourth logic gate 650-*a* may similarly be configured to generate an output signal based on a current, a delayed signal, or both. In some cases, second logic gate 640-*a* may be configured to generate a low output signal when a voltage of the two inputs are different and a low output signal when a voltage of the two inputs are equivalent—e.g., second logic gate 640-*a* may include an exclusive-or (XOR) gate. In some cases, third logic gate 645-*a* may include an XNOR gate and fourth logic gate 650-*a* may include an XOR gate.

In some cases, first delay component 615-*a*, second delay component 620-*a*, first logic gate 635-*a*, and second logic gate 640-*a* may be configured to process an MSB of consecutive logic values, as represented by MSB path 680-*a*, while third delay component 625-*a*, fourth delay component 630-*a*, third logic gate 645-*a*, and fourth logic gate 650-*a* may be configured to process an LSB of consecutive logic values, as represented by LSB path 685-*a*. For example, a voltage corresponding to a first MSB of a first logic value ("MSB1") and a voltage corresponding to a subsequent MSB of a second logic value ("MSB2") may be communicated to MSB path 680-*a* while a voltage corresponding to a first LSB of the first logic value ("LSB1") and a voltage corresponding to a subsequent LSB of the second logic value may be communicated to LSB path 685-*a* ("LSB2").

MSB1 may be applied to a first input of first logic gate 635-*a*, a first input of second logic gate 640-*a*, first delay component 615-*a*, and to second delay component 620-*a*. Subsequently, MSB2 may be applied to the first input of first logic gate 635-*a* and second logic gate 640-*a* and a delayed version of MSB1 may be applied to a second input of first logic gate 635-*a* and a second input of second logic gate 640-*a*. First logic gate 635-*a* and second logic gate 640-*a* may compare the voltages applied at their respective inputs and may output a voltage (e.g., a high or low voltage) accordingly.

In some examples, if MSB1 represents a logic value 0 and MSB2 represents a logic value 1, logic circuit 610-*a* may determine that a positive change between MSB1 and MSB2 has occurred. In some cases, after identifying a positive change between MSB1 and MSB2, first logic gate 635-*a* outputs a low voltage and second logic gate 640-*a* outputs a low voltage. In other examples, if MSB1 represents a logic value 1 and MSB2 represents a logic value 0, logic circuit 610-*a* may determine that a negative change between MSB1 and MSB2 has occurred and first logic gate 635-*a* may output a high voltage and second logic gate 640-*a* may output a high voltage. And in other examples, if MSB1 represents a logic value 0 and MSB2 represents a logic value 0, logic circuit 610-*a* may determine that no change between MSB1 and MSB2 has occurred and first logic gate 635-*a* may output a high voltage and second logic gate 640-*a* may output a low voltage.

LSB1 and LSB2 may be similarly applied to a first input of third logic gate 645-*a*, a first input of fourth logic gate 650-*a*, third delay component 625-*a*, and to fourth delay component 630-*a*. And logic circuit 610-*a* may determine whether a positive, negative, or no change occurs between LSB1 and LSB2. Accordingly, third logic gate 645-*a* and fourth logic gate 650-*a* may output high or low voltages.

Adaptive driver 655-*a* may be configured to generate a current based on an output voltage received from logic circuit 610-*a*. In some cases, a magnitude and/or direction of the generated current varies based on the output received from logic circuit 610-*a*—e.g., adaptive driver 655-*a* may generate a larger or smaller current based on the received output. In some examples, adaptive driver 655-*a* may push current onto or pull current from a channel, such as channel 520 of FIGS. 5A and 5B.

Adaptive driver 655-*a* may include a first transistor 660-*a*, a second transistor 665-*a*, third transistor 670-*a*, and fourth transistor 675-*a*.

First transistor 660-a may be configured to allow current to flow from a voltage source to output line 690-a. First transistor 660-a may be a p-doped transistor and may be configured to conduct current when a voltage at an input (or "gate") of first transistor 660-a is below a voltage of another input (or "source") of first transistor 660-a by at least a threshold voltage. In some cases, first transistor 660-a may be connected between a positive voltage supply and output line 690-a. Third transistor 670-a may be similarly configured to first transistor 660-a.

Second transistor 665-a may be configured to allow current to flow from output line 690-a to a voltage source or virtual ground reference. Second transistor 665-a may be an n-doped transistor and may be configured to conduct current when a voltage at an input (or "gate") of second transistor 665-a is above a voltage of another input (or "source") of second transistor 665-a by at least a threshold voltage. In some cases, second transistor 665-a may be connected between a positive voltage supply and output line 690-a. Fourth transistor 675-a may be similarly configured to second transistor 665-a.

In some cases, a width of first transistor 660-a and second transistor 665-a may be larger than (e.g., twice as large) a width of third transistor 670-a and fourth transistor 675-a. In some cases, first transistor 660-a and second transistor 665-a may be used to generate a current for output line 690-a based on a change in an MSB measured by logic circuit 610-a, as represented by MSB path 680-a.

For example, if logic circuit 610-a measures a positive change in MSB1 and MSB2, a low voltage may be detected at a gate of first transistor 660-a and a low voltage may be detected at a gate of second transistor 665-a. Accordingly, first transistor 660-a may transition to an active state allowing current to flow from a voltage source to output line 690-a while second transistor may remain in a deactivated state. In some cases, first transistor 660-a may be activated for a limited period of time during which a voltage on a channel that is in electronic communication with output line 690-a is transitioning from one voltage level to another voltage level. In some cases, the delay introduced by delay components 615-a to 630-a is based at least in part on a transition period for the channel.

Third transistor 670-a and fourth transistor 675-a may similarly be used to generate a current for output line 690-a based on a change in an LSB measured by logic circuit 610-a, as represented by LSB path 685-a. The current generated by the transistors included in MSB path 680-a and the current generated by the transistors including in LSB path 685-a may be combined to produce a combined current. In some cases, the largest combined current is generated when first transistor 660-a and third transistor 670-a are activated and second transistor 665-a and fourth transistor 675-a are deactivated. The second largest current is generated when first transistor 660-a is active and second transistor 665-a, third transistor 670-a, and fourth transistor 675-a are deactivated. The third largest current is generated when first transistor 660-a and fourth transistor 675-a are activated and second transistor 665-a and third transistor 670-a are deactivated, and so on.

Figure 6B:
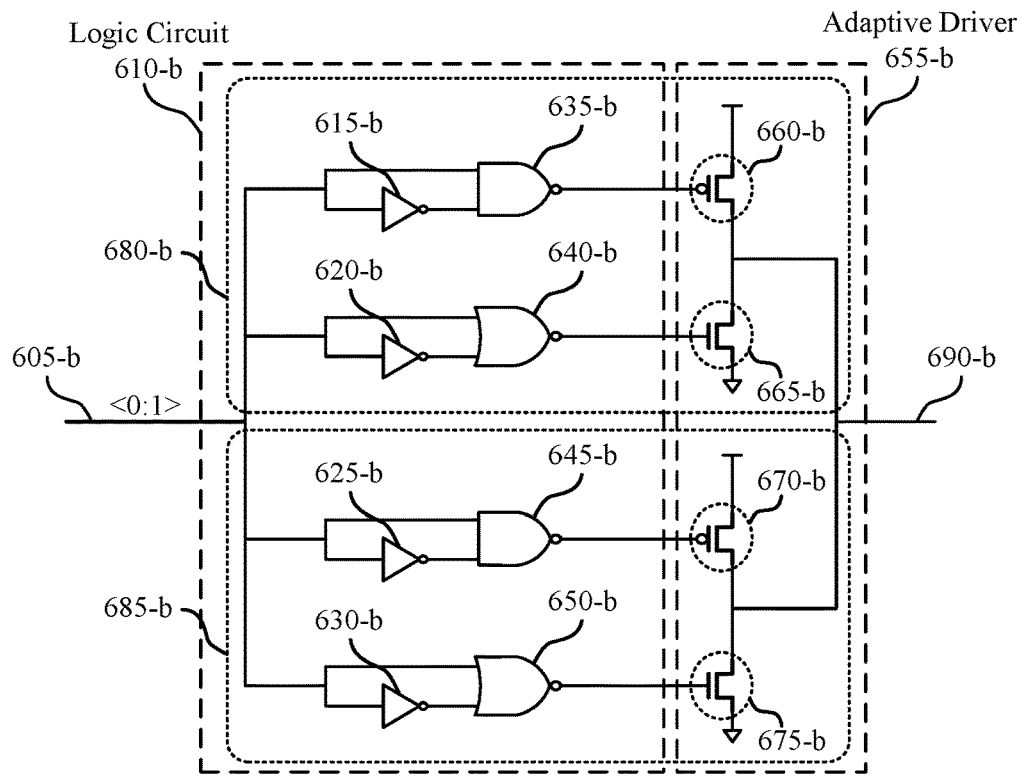

FIG. 6B illustrates an example of a slew rate enhancement circuit that supports adapting the current on a channel as disclosed herein.

Slew rate enhancer 600-b may be an example of aspects of slew rate enhancer 600-a of FIG. 6A. Slew rate enhancer 600-b may include input line 605-b, logic circuit 610-b, adaptive driver 655-b, and output line 690-b, which may be examples of input line 605-a, logic circuit 610-a, adaptive driver 655-a, and output line 690-a of FIG. 6A, respectively.

Delay components 615-b to 630-b may be configured to delay and flip a voltage of an applied signal, and may be referred to as inverters. First logic gate 635-b may be configured to generate a low output voltage when a present voltage and a voltage flipped and delayed by first delay component 615-b are both high and to generate a high output voltage otherwise. In some cases, first logic gate 635-b may be a not and (NAND) gate. In some examples, third logic gate 645-b may be similarly configured as first logic gate 635-b.

Second logic gate 640-b may be configured to generate a high output voltage when a present voltage and a voltage flipped and delayed by second delay component 620-b are both low and to generate a low output voltage otherwise. In some cases, second logic gate 640-b may be a NOR gate. In some examples, fourth logic gate 650-b may be similarly configured as second logic gate 640-b.

In some examples, slew rate enhancer 600-b is configured to push current to or pull current from a channel, such as channel 520 of FIGS. 5A and 5B, via output line 690-b. For example, if an MSB of a first logic value ("MSB1") has logic value 0, an MSB of a second logic value ("MSB2") has logic value 1, an LSB of the first logic value ("LSB1") has logic value 1, and an LSB of the second logic value ("LSB2") has logic value 1—e.g., the first logic value is logic 01 and the second logic value is logic 11—then first logic gate 635-b may output a low voltage, second logic gate 640-b may output a low voltage, third logic gate 645-b may output a high voltage, and fourth logic gate may output a low voltage.

Accordingly, first transistor 660-b may transition to an activated state while second transistor 665-b, third transistor 670-b, and fourth transistor 675-b may remain in a deactivated state, and current may be delivered to output line 690-b via first transistor 660-b. In another example if MSB1 has logic value 0, MSB2 has logic value 1, LSB1 has logic value 0, and LSB2 has logic value 1, then first transistor 660-b and third transistor 670-b may transition to an activated state while second transistor 665-b and fourth transistor 675-b may remain in a deactivated state. And an increased amount of current—relative to the previous example—may be delivered to output line 690-b via first transistor 660-b.

Figure 7:
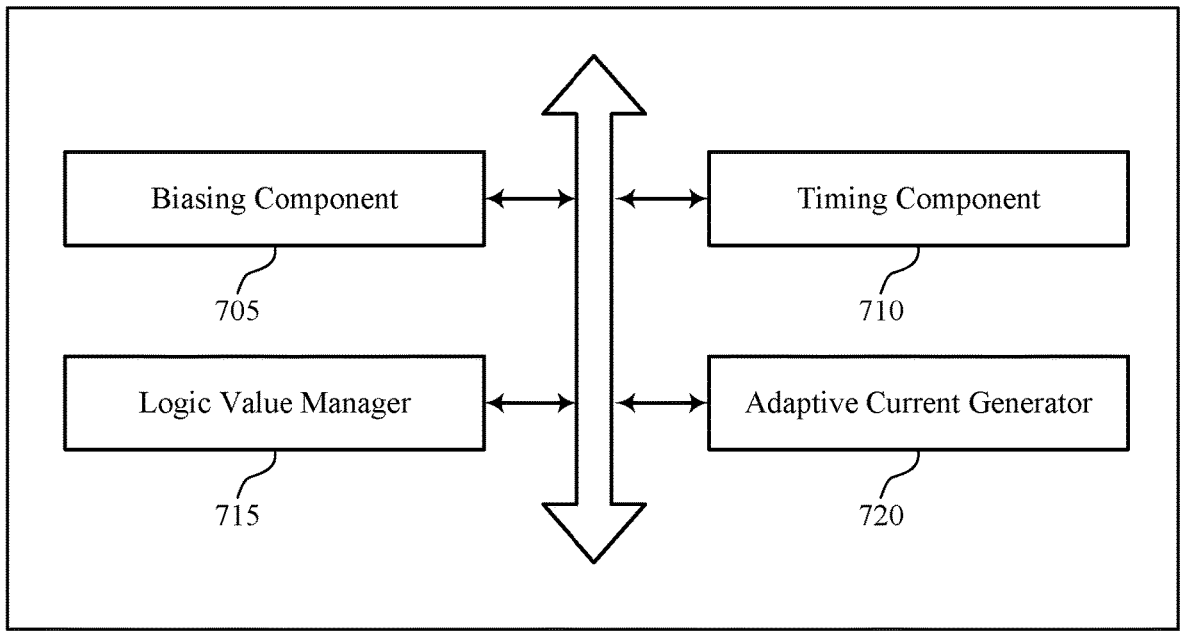
FIG. 7 illustrates a block diagram of a memory controller that supports adapting the current on a channel as disclosed herein.

FIG. 7 illustrates a block diagram of a memory controller that supports adapting the current on a channel as disclosed herein.

Memory controller 700 may be configured to apply a first voltage to the channel based at least in part on a first logic value; apply, after applying the first voltage, a second voltage to the channel based at least in part on a second logic value; compare the first logic value and the second logic value; and adapt, while applying the second voltage, a current on the channel based at least in part on comparing the first logic value and the second logic value. Memory controller 700 may include biasing component 705, timing component 710, logic value manager 715, and an adaptive current generator 720.

In some cases, biasing component 705 may be configured to apply a first voltage to the channel based at least in part on a first logic value and to apply a second, subsequent voltage to the channel based at least in part on a second logic value. In some cases, biasing component 705 may apply, for a second period and after applying the second voltage, a third voltage to the channel based at least in part on a third logic value. In some cases, timing component 710 may be configured to control when biasing component 705 applies the first voltage and the second voltage.

Logic value manager 715 may be configured to identify the first logic value and the second logic value in a bit stream. Logic value manager 715 may compare the first logic value and the second logic value and may determine a difference between the first logic value and the second logic value. In some cases, logic value manager 715 may determine a value corresponding to a difference between the first logic value and the second logic value based at least in part on the comparing. For instance, if the first logic value is 00 and the second logic value is 11, then logic value manager 715 may calculate the value 3. If the first logic value is 10 and the second logic value is 01, then logic value manager 715 may calculate the value −1. And so on. Logic value manager 715 may also determine a second difference between the second logic value and a third logic value based on the comparison. Logic value manager 715 may also transmit the difference to the adaptive current generator 720, where the adaptive current generator 720 may be configured to adapt the current on the channel based at least on the difference Adaptive current generator 720 may be configured to adapt, while the second voltage is being applied by biasing component 705 (e.g., before or concurrently with applying the second voltage), a current on the channel based at least in part on comparing the first logic value and the second logic value. In some cases, adaptive current generator 720 may increase the current on a channel based at least in part on a value corresponding to a difference between the first logic value and the second logic value determined by logic value manager 715. Adaptive current generator 720 may also be configured to adapt a second current on the channel before or during a second period during which a third voltage is applied to the channel based at least in part on the second difference. In some cases, timing component 710 may be configured to control when adaptive current generator 720 adapts a current of the channel.

Figure 8:
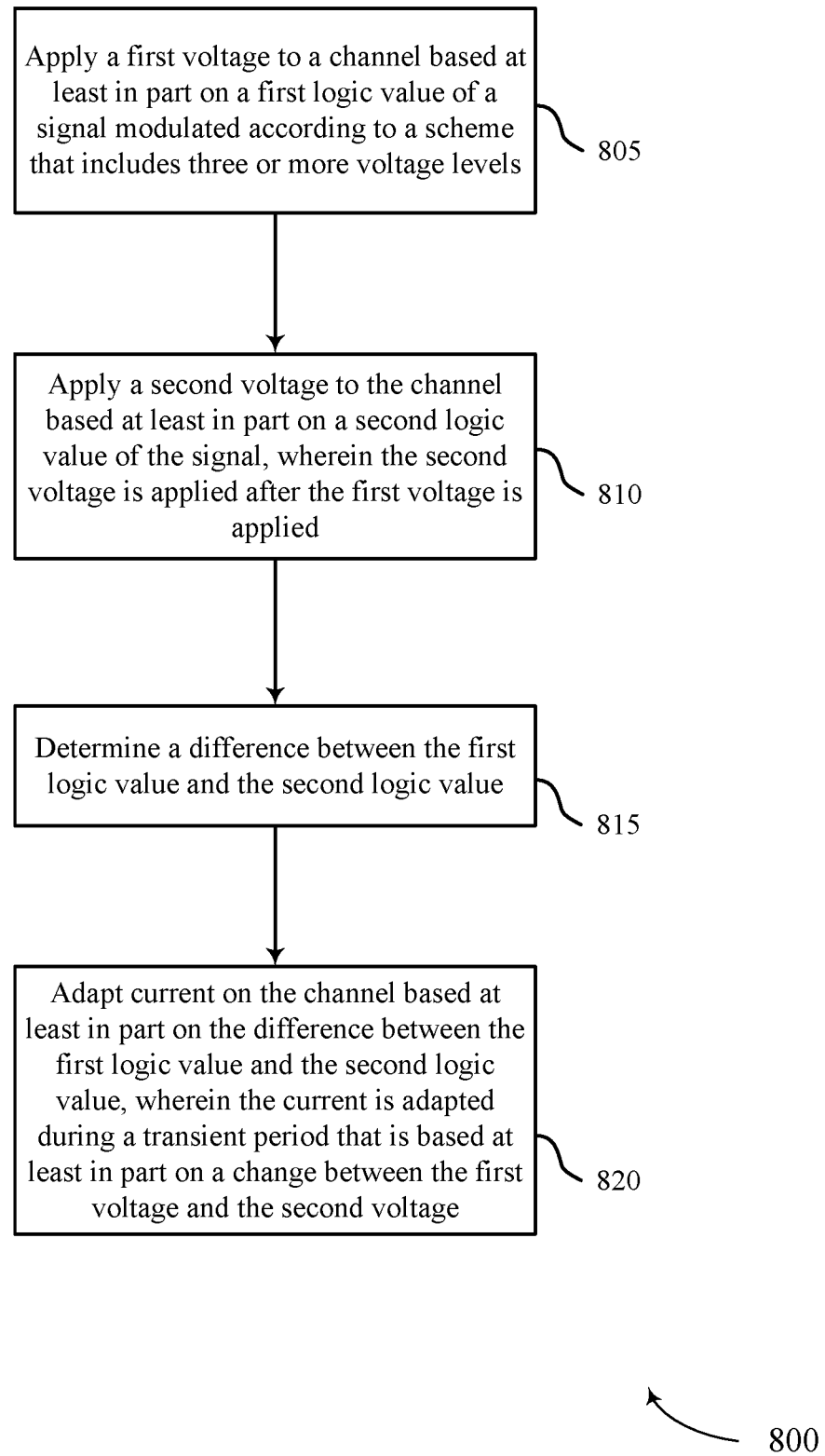
FIG. 8 illustrates a flowchart of a method or methods for adapting the current on a channel as disclosed herein.

FIG. 8 illustrates a flowchart of a method or methods for adapting the current on a channel as disclosed herein.

Method 800 may illustrate aspects of programming a resistance of a memory cell containing a single segregable material by causing ion movement within the material.

At block 805, the method may include applying a first voltage to a channel based at least in part on a first logic value of a signal modulated according to a scheme that includes three or more voltage levels, as described with reference to FIGS. 1-6. In certain examples, the operations of block 805 may be performed or facilitated by a memory controller, as described with reference to FIGS. 1-3 and 7.

At block 810, the method may include applying a second voltage to the channel based at least in part on a second logic value of the signal, wherein the second voltage is applied after the first voltage is applied, as described with reference to FIGS. 1-6. In certain examples, the operations of block 805 may be performed or facilitated by a memory controller, as described with reference to FIGS. 1-3 and 7.

At block 815, the method may include determining a difference between the first logic value and the second logic value, as described with reference to FIGS. 1-6. In certain examples, the operations of block 805 may be performed or facilitated by a memory controller, as described with reference to FIGS. 1-3 and 7.

At block 820, the method may include adapting current on the channel based at least in part on the difference between the first logic value and the second logic value, wherein the current is adapted during a transient period that is based at least in part on a change between the first voltage and the second voltage, as described with reference to FIGS. 1-6. In certain examples, the operations of block 805 may be performed or facilitated by a memory controller, as described with reference to FIGS. 1-3 and 7.

In some examples, an apparatus as disclosed herein may perform a method or methods, such as the method 800. The apparatus may include features, means, or instructions (e.g., a non-transitory computer-readable medium storing instructions executable by a processor) for applying a first voltage to a channel based at least in part on a first logic value of a signal modulated according to a scheme that includes three or more voltage levels; applying a second voltage to the channel based at least in part on a second logic value of the signal, wherein the second voltage is applied after the first voltage is applied; determining a difference between the first logic value and the second logic value; and adapting current on the channel based at least in part on the difference between the first logic value and the second logic value, wherein the current is adapted during a transient period that is based at least in part on a change between the first voltage and the second voltage.

Some examples of the method, apparatuses, and non-transitory computer-readable medium described herein may further include operations, features, means, or instructions for increasing or decreasing the current on the channel as a function of the difference between the first logic value and the second logic value.

Some examples of the method, apparatuses, and non-transitory computer-readable medium described herein may further include operations, features, means, or instructions for applying signaling indicative of the difference to an input of an adaptive driver. In some examples of the method, apparatuses, and non-transitory computer-readable medium described herein, the current is adapted by the adaptive driver based at least on the difference.

Some examples of the method, apparatuses, and non-transitory computer-readable medium described herein may further include operations, features, means, or instructions for comparing the first logic value and the second logic value; and determining a value corresponding to the difference based at least in part on the comparing. In some examples of the method, apparatuses, and non-transitory computer-readable medium described herein, adapting the current is based at least in part on the value of the difference.

Some examples of the method, apparatuses, and non-transitory computer-readable medium described herein may further include operations, features, means, or instructions for generating a signal representative of the difference between the first logic value and the second logic value.

Some examples of the method, apparatuses, and non-transitory computer-readable medium described herein may further include operations, features, means, or instructions for applying, after applying the second voltage, a third voltage to the channel based at least in part on a third logic value of the signal, wherein the voltage on the channel transitions from the second level to a third level during a second period based at least in part on applying the second voltage and the third voltage; determining a second difference between the second logic value and the third logic value; and adapting second current on the channel before or within the second period based at least in part on the second difference.

In some examples of the method, apparatuses, and non-transitory computer-readable medium described herein, a voltage of the channel transitions from a first level to a second level during the transient period based at least in part on applying the first voltage and the second voltage. In some examples of the method, apparatuses, and non-transitory computer-readable medium described herein, adapting the current on the channel comprises increasing the current by a first amount.

In some examples of the method, apparatuses, and non-transitory computer-readable medium described herein, the second difference is greater than the difference between the first logic value and the second logic value, and wherein adapting the current on the channel comprises increasing the second current by a second amount that is greater than the first amount.

In some examples of the method, apparatuses, and non-transitory computer-readable medium described herein, a rate that the voltage on the channel transitions from the first level to the second level is based at least in part on adapting the current, and wherein a duration of the transient period is based at least in part on the increase in the current.

Some examples of the method, apparatuses, and non-transitory computer-readable medium described herein may further include operations, features, means, or instructions for receiving the signal comprising the first logic value and the second logic value; identifying the first logic value, wherein the first voltage applied to the channel is based at least in part on the first logic value; and identifying the second logic value, wherein the second voltage applied to the channel is based at least in part on the second logic value.

In some examples of the method, apparatuses, and non-transitory computer-readable medium described herein, adapting the current occurs before or concurrently with applying the second voltage.

It should be noted that the methods described above describe possible implementations, and that the operations and the steps may be rearranged or otherwise modified and that other implementations are possible. Furthermore, examples from two or more of the methods may be combined.

In some examples, an apparatus or device may perform aspects of the functions described herein using general, or special-purpose hardware. For example, an apparatus or device may include a transmitter configured to apply, to a channel, a first voltage corresponding to a first logic value and a second voltage corresponding to a second logic value; a logic circuit configured to generate a signal corresponding to a difference between the first logic value and the second logic value; and an adaptive driver configured to adapt, based at least in part on the signal, a current on the channel during a transient period that is based at least in part on a change between the first voltage and the second voltage.

In some examples of the apparatus or device, the logic circuit includes a plurality of inverters configured to delay a transmission of the first logic value; and a plurality of logic gates configured to receive the second logic value and the delayed first logic value and further configured to transmit the signal to the adaptive driver based at least in part on the second logic value and the delayed first logic value. In some examples of the apparatus or device, the plurality of logic gates includes a logic gate including an exclusive OR (XOR) gate, a non-exclusive OR (NXOR) gate, a NAND gate, or a not OR (NOR) gate, or any combination thereof.

In some examples of the apparatus or device, the adaptive driver includes a first set of transistors configured to adapt a current on the channel based at least in part on a first difference between a first bit of the first logic value and a first bit of the second logic value, wherein the first bit of the first logic value and the first bit of the second logic value share a first corresponding bit position; and a second set of transistors configured to adapt a current on the channel based at least in part on a second difference between a second bit of the first logic value and a second bit of the second logic value, wherein the second bit of the first logic value and the second bit of the second logic value share a second corresponding bit position.

In some examples of the apparatus or device, the first set of transistors includes a first n-doped transistor and a first p-doped transistor, and wherein the second set of transistors comprises a second n-doped transistor and a second p-doped transistor.

In some examples of the apparatus or device, the logic circuit includes a first set of logic gates configured to apply a first plurality of voltages to the adaptive driver; a first plurality of delay elements configured to delay a transmission of an MSB of the first logic value to the first set of logic gates, wherein the first set of logic gates is configured to process an MSB of the second logic value and the delayed MSB of the first logic value; a second set of logic gates configured to apply a second plurality of voltages to the adaptive driver; and a second plurality of delay elements configured to delay a transmission of an LSB of the first logic value to the second set of logic gates, wherein the second set of logic gates is configured to process an LSB of the second logic value and the delayed LSB of the first logic value.

In some examples, the apparatus or device includes a receiver configured to receive a second signal with a modulation scheme that includes three or more voltage levels and to generate a plurality of bits based on the signal; a logic value detector configured to identify the first logic value and the second logic value from the plurality of bits; and a bit splitter configured to identify a first bit and a second bit of the first logic value.

In some examples of the apparatus or device, the adaptive driver includes is further configured to adapt the current on the channel by an amount that corresponds to the difference between the first logic value and the second logic value.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (e.g., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

The devices discussed herein, including system 100, memory die 200, and memory system 300 may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (e.g., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
    applying a first voltage to a channel based at least in part on a first logic value of a signal modulated according to a scheme that includes three or more voltage levels, the first logic value comprising a first most significant bit (MSB) and a first least significant bit (LSB);
    applying, for a first time period, a second voltage to the channel based at least in part on a second logic value of the signal, the second logic value comprising a second MSB and a second LSB, wherein the second voltage is applied after the first voltage is applied;
    determining a first difference between the first MSB and the second MSB and a second difference between the first LSB and the second LSB;
    applying signaling indicative of the first difference and the second difference to an input of an adaptive driver;
    adapting, using the adaptive driver and during a transient period that occurs before or concurrently with the first time period, current on the channel, wherein the adaptive driver comprises a first set of transistors operable to adapt the current on the channel by a first amount based at least in part on the first difference between the first MSB and the second MSB and a second set of transistors operable to adapt the current on the channel by a second amount based at least in part on the second difference between the first LSB and the second LSB, wherein a duration of the transient period is based at least in part on the first difference and the second difference;
    applying, for a second time period, a third voltage to the channel based at least in part on a third logic value of the signal, the third logic value comprising a third MSB and a third LSB, wherein the third voltage is applied after the second voltage is applied;
    determining a third difference between the second MSB and the third MSB and a fourth difference between the second LSB and the third LSB; and
    applying signaling indicative of the third difference and the fourth difference to the input of the adaptive driver.

2. The method of claim 1, further comprising:
    increasing or decreasing the current on the channel as a function of the first difference and the second difference.

3. The method of claim 1, further comprising:
    comparing the first logic value and the second logic value, wherein determining the first difference is based at least in part on the comparing.

4. The method of claim 1, further comprising:
    generating a second signal representative of the first difference and the second difference.

5. The method of claim 1, wherein a voltage of the channel transitions from a first level to a second level during the transient period based at least in part on applying the first voltage and the second voltage, and wherein adapting the current on the channel comprises increasing the current by the first amount.

6. The method of claim 5, wherein a rate that the voltage on the channel transitions from the first level to the second level is based at least in part on adapting the current, and wherein the duration of the transient period is based at least in part on the increase in the current.

7. The method of claim 1, further comprising:
    adapting, using the adaptive driver and during a second transient period that occurs before or concurrently with the second time period, second current on the channel, wherein a duration of the second transient period is based at least in part on the third difference and the fourth difference.

8. The method of claim 7, wherein the third difference or the fourth difference is greater than the first difference or the second difference, respectively, and wherein adapting the current on the channel comprises increasing the second current by the second amount that is greater than the first amount.

9. The method of claim 1, further comprising:
    receiving the signal comprising the first logic value and the second logic value;
    identifying the first logic value, wherein the first voltage applied to the channel is based at least in part on the first logic value; and
    identifying the second logic value, wherein the second voltage applied to the channel is based at least in part on the second logic value.

10. The method of claim 1, wherein the first difference corresponds to no difference between the first MSB and the second MSB, the second difference corresponds to no difference between the first LSB and the second LSB, the third difference corresponds to no difference between the second MSB and the third MSB, the fourth difference corresponds to no difference between the second LSB and the third LSB, or any combination thereof.

11. The method of claim 1, wherein determining the first difference between the first MSB and the second MSB and the second difference between the first LSB and the second LSB comprises:
    generating, using a logic circuit, the signaling indicative of the first difference and the second difference, wherein the logic circuit comprises a first set of logic gates configured to process the first MSB and the second MSB and a second set of logic gates configured to process the first LSB and the second LSB.

12. An apparatus, comprising:
    a transmitter configured to:
        apply, to a channel, a first voltage corresponding to a first logic value, the first logic value comprising a first most significant bit (MSB) and a first least significant bit (LSB);
        apply, to the channel during a first time period, a second voltage corresponding to a second logic value, the second logic value comprising a second MSB and a second LSB; and apply, to the channel during a second time period, a third voltage corresponding to a third logic value, the third logic value comprising a third MSB and a third LSB;

a logic circuit configured to:
  determine a first difference between the first MSB and the second MSB and a second difference between the first LSB and the second LSB;
  generate a signal corresponding to the first difference and the second difference;
  determine a third difference between the second MSB and the third MSB and a fourth difference between the second LSB and the third LSB; and
  generate a signal corresponding to the third difference and the fourth difference; and an adaptive driver configured to adapt, during a transient period that occurs before or concurrently with the first time period and based at least in part on the signal, a current on the channel, wherein the adaptive driver comprises a first set of transistors operable to adapt current on the channel by a first amount based at least in part on the first difference between the first MSB and the second MSB and a second set of transistors operable to adapt the current on the channel by a second amount based at least in part on the second difference between the first LSB and the second LSB, wherein a duration of the transient period is based at least in part on the first difference and the second difference.

13. The apparatus of claim 12, wherein the logic circuit comprises:
  a plurality of inverters configured to delay a transmission of the first logic value; and
  a plurality of logic gates configured to receive the second logic value and the delayed first logic value and further configured to transmit the signal to the adaptive driver based at least in part on the second logic value and the delayed first logic value.

14. The apparatus of claim 13, wherein:
  a logic gate of the plurality of logic gates comprises an exclusive OR (XOR) gate, a non-exclusive OR (NXOR) gate, a not AND (NAND) gate, or a not OR (NOR) gate, or any combination thereof.

15. The apparatus of claim 12, wherein the first set of transistors comprises a first n-doped transistor and a first p-doped transistor, and wherein the second set of transistors comprises a second n-doped transistor and a second p-doped transistor.

16. The apparatus of claim 12, wherein the logic circuit comprises:
  a first set of logic gates configured to apply a first plurality of voltages to the adaptive driver;
  a first plurality of delay elements configured to delay a transmission of the first MSB to the first set of logic gates, wherein the first set of logic gates is configured to process the second MSB and the delayed first MSB;
  a second set of logic gates configured to apply a second plurality of voltages to the adaptive driver; and
  a second plurality of delay elements configured to delay a transmission of the first LSB to the second set of logic gates, wherein the second set of logic gates is configured to process the second LSB and the delayed first LSB.

17. The apparatus of claim 12, further comprising:
  a receiver configured to receive a second signal with a modulation scheme that includes three or more voltage levels and to generate a plurality of bits based on the signal; and
  a logic value detector configured to identify the first logic value and the second logic value from the plurality of bits.

18. The apparatus of claim 12, further comprising:
  a bit splitter configured to identify a first bit and a second bit of the first logic value.

19. The apparatus of claim 12, wherein the adaptive driver is further configured to adapt the current on the channel by the first amount that corresponds to the first difference and the second difference.

20. The apparatus of claim 12, wherein the first difference corresponds to no difference between the first MSB and the second MSB, the second difference corresponds to no difference between the first LSB and the second LSB, the third difference corresponds to no difference between the second MSB and the third MSB, the fourth difference corresponds to no difference between the second LSB and the third LSB, or any combination thereof.

21. The apparatus of claim 12, wherein the logic circuit comprises a first set of logic gates configured to process the first MSB and the second MSB and a second set of logic gates configured to process the first LSB and the second LSB.

22. An apparatus, comprising:
  a transmitter; a channel coupled with the transmitter; and
  one or more controllers coupled with the transmitter and the channel, the one or more controllers operable to cause the apparatus to:
    apply a first voltage to the channel based at least in part on a first logic value, the first logic value comprising a first most significant bit (MSB) and a first least significant bit (LSB);
    apply, after applying the first voltage, a second voltage to the channel based at least in part on a second logic value, the second logic value comprising a second MSB and a second LSB;
    compare the first logic value and the second logic value;
    determine a first difference between the first MSB and the second MSB and a second difference between the first LSB and the second LSB;
    transmit signaling indicative of the first difference to an input of an adaptive driver;
    adapt, using the adaptive driver and during a first time period and while applying the second voltage, a current on the channel by a first amount that is based at least in part on the first difference and the second difference, wherein a duration of the first time period is based at least in part on the first difference and the second difference, wherein the adaptive driver comprises a first set of transistors operable to adapt the current on the channel by a second amount based at least in part on the first difference between the first MSB and the second MSB and a second set of transistors operable to adapt the current on the channel by a third amount that is based at least in part on the second difference between the first LSB and the second LSB;
    apply, after applying the second voltage, a third voltage to the channel based at least in part on a third logic value, the third logic value comprising a third MSB and a third LSB;
    determine a third difference between the second MSB and the third MSB and a fourth difference between the second LSB and the third LSB; and transmit signaling indicative of the third difference and the fourth difference to the input of the adaptive driver.

23. The apparatus of claim 22, wherein the one or more controllers are further operable to cause the apparatus to:
adapt, during a second time period and while applying the third voltage, a second current on the channel by a fourth amount that is based at least in part on the third difference and the fourth difference between, wherein a duration of the second time period is based at least in part on the third difference and the fourth difference.

24. The apparatus of claim 22, wherein the first difference corresponds to no difference between the first MSB and the second MSB, the second difference corresponds to no difference between the first LSB and the second LSB, the third difference corresponds to no difference between the second MSB and the third MSB, the fourth difference corresponds to no difference between the second LSB and the third LSB, or any combination thereof.

* * * * *